(12) United States Patent
Yu et al.

(10) Patent No.: US 12,251,786 B2
(45) Date of Patent: Mar. 18, 2025

(54) FILTER APPARATUS FOR SEMICONDUCTOR DEVICE FABRICATION PROCESS

(71) Applicant: TAIWAN SEMICONDUCTOR MANUFACTURING CO., LTD., Hsinchu (TW)

(72) Inventors: Chwen Yu, Taipei (TW); Chih-Chiang Tseng, Xinfeng Township (TW); Yi-Chung Lai, Hsinchu County (TW); Tzu-Sou Chuang, Hsinchu (TW); Yun-Ju Chia, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1065 days.

(21) Appl. No.: 16/952,730

(22) Filed: Nov. 19, 2020

(65) Prior Publication Data

US 2021/0362291 A1    Nov. 25, 2021

Related U.S. Application Data

(60) Provisional application No. 63/028,626, filed on May 22, 2020.

(51) Int. Cl.
*B24B 37/04*    (2012.01)
*B01D 63/06*    (2006.01)
(Continued)

(52) U.S. Cl.
CPC ............ *B24B 37/044* (2013.01); *B01D 63/06* (2013.01); *B01D 63/082* (2013.01); *B01D 65/02* (2013.01);
(Continued)

(58) Field of Classification Search
CPC ......... B24B 55/02; B24B 55/03; B24B 57/00; B24B 57/02; B24B 57/04; B01D 63/082;
(Continued)

(56) References Cited

U.S. PATENT DOCUMENTS 3,132,099 A  *  5/1964  Eilhauer .............. B01D 39/086
                                                             156/181
4,889,631 A  *  12/1989  Rigby ................... B01D 71/025
                                                             210/493.1

(Continued)

FOREIGN PATENT DOCUMENTS

CN        103426799 A    12/2013
CN        103846015 A     6/2014
(Continued)

OTHER PUBLICATIONS

Yong-Jin Seo et al., "Advantages of point of use (POU) slurry filter and high spray method for reduction of CMP process defects," Microelectronic Engineering, 70 (2003) 1-6.
(Continued)

*Primary Examiner* — Joel D Crandall
(74) *Attorney, Agent, or Firm* — STUDEBAKER BRACKETT PLLC

(57) ABSTRACT

A filter device includes one or more filter membranes, and a filter housing enclosing the one or more filter membranes. Each of the filter membranes includes a base membrane made of a ceramic material, and a plurality of through holes. The base membrane is coated with a coating material.

20 Claims, 16 Drawing Sheets

(51) Int. Cl.
| | |
|---|---|
| *B01D 63/08* | (2006.01) |
| *B01D 65/02* | (2006.01) |
| *B01D 67/00* | (2006.01) |
| *B01D 69/02* | (2006.01) |
| *B01D 69/12* | (2006.01) |
| *B01D 69/14* | (2006.01) |
| *B01D 71/02* | (2006.01) |
| *B01D 71/26* | (2006.01) |
| *B01D 71/52* | (2006.01) |
| *C04B 38/00* | (2006.01) |
| *C04B 41/00* | (2006.01) |
| *C04B 41/48* | (2006.01) |
| *C04B 41/83* | (2006.01) |
| *H01L 21/67* | (2006.01) |

(52) U.S. Cl.
CPC ......... *B01D 67/0079* (2013.01); *B01D 69/02* (2013.01); *B01D 69/1216* (2022.08); *B01D 69/1411* (2022.08); *B01D 71/025* (2013.01); *B01D 71/261* (2022.08); *B01D 71/5222* (2022.08); *C04B 38/0009* (2013.01); *C04B 41/009* (2013.01); *C04B 41/48* (2013.01); *C04B 41/83* (2013.01); *H01L 21/67017* (2013.01); *B01D 2321/04* (2013.01); *B01D 2325/0283* (2022.08); *B01D 2325/04* (2013.01)

(58) Field of Classification Search
CPC ...... B01D 63/06; B01D 69/02; B01D 71/025; B01D 71/5222; B01D 69/1411; B01D 69/1216; B01D 2325/0283; C04B 41/009; C04B 41/48; C04B 41/83; C04B 38/009
See application file for complete search history.

(56) References Cited

U.S. PATENT DOCUMENTS

| | | | | |
|---|---|---|---|---|
| 5,753,014 | A * | 5/1998 | Van Rijn | B01J 35/59 |
| | | | | 96/13 |
| 6,280,300 | B1 * | 8/2001 | Komatsu | B01D 35/12 |
| | | | | 451/87 |
| 6,592,708 | B2 * | 7/2003 | Vanell | B24B 57/02 |
| | | | | 257/E21.244 |
| 9,855,529 | B2 | 1/2018 | Brummer | |
| 10,109,505 | B2 | 10/2018 | Zhang et al. | |
| 2003/0226339 | A1 * | 12/2003 | Igarashi | B01D 46/521 |
| | | | | 55/482 |
| 2010/0154370 | A1 * | 6/2010 | Jensen | B01D 46/2482 |
| | | | | 55/495 |
| 2011/0174745 | A1 | 7/2011 | Kim et al. | |
| 2016/0038866 | A1 * | 2/2016 | Gibson | B01D 39/2093 |
| | | | | 264/401 |
| 2017/0283326 | A1 * | 10/2017 | Macedo | C04B 41/53 |
| 2021/0370237 | A1 * | 12/2021 | Dorin | C02F 1/44 |

FOREIGN PATENT DOCUMENTS

| | | | |
|---|---|---|---|
| CN | 103998114 A | | 8/2014 |
| CN | 104364004 B | | 12/2016 |
| CN | 110125782 A | * | 8/2019 |
| DE | 694 34 999 T2 | | 4/2008 |
| JP | 2671646 B2 | | 7/1997 |
| JP | H10118899 A | * | 5/1998 ........... B01D 61/145 |
| JP | 2001-334114 A | | 12/2001 |
| KR | 10-0929039 B1 | | 11/2009 |
| KR | 10-2010-0034521 A | | 4/2010 |
| KR | 10-1454386 B1 | | 10/2014 |
| TW | I612999 B | | 2/2018 |
| WO | 2010/111291 A2 | | 9/2010 |

OTHER PUBLICATIONS

B. H. Wood, A. Hsu and B. Shie, "The Benefits of Multi-Stage Filtration for Improved CMP Slurry Large Particle Retention," 2019 30th Annual SEMI Advanced Semiconductor Manufacturing Conference (ASMC), Saratoga Springs, Ny, USA, 2019, pp. 1-4, doi: 10.1109/ASMC.2019.8791775.

"Anodic aluminium oxide." Wikipedia: The Free Encyclopedia, Retrieved from the internet https://en.wikipedia.org/wiki/Anodic_aluminium_oxide on Nov. 12, 2020.

* cited by examiner

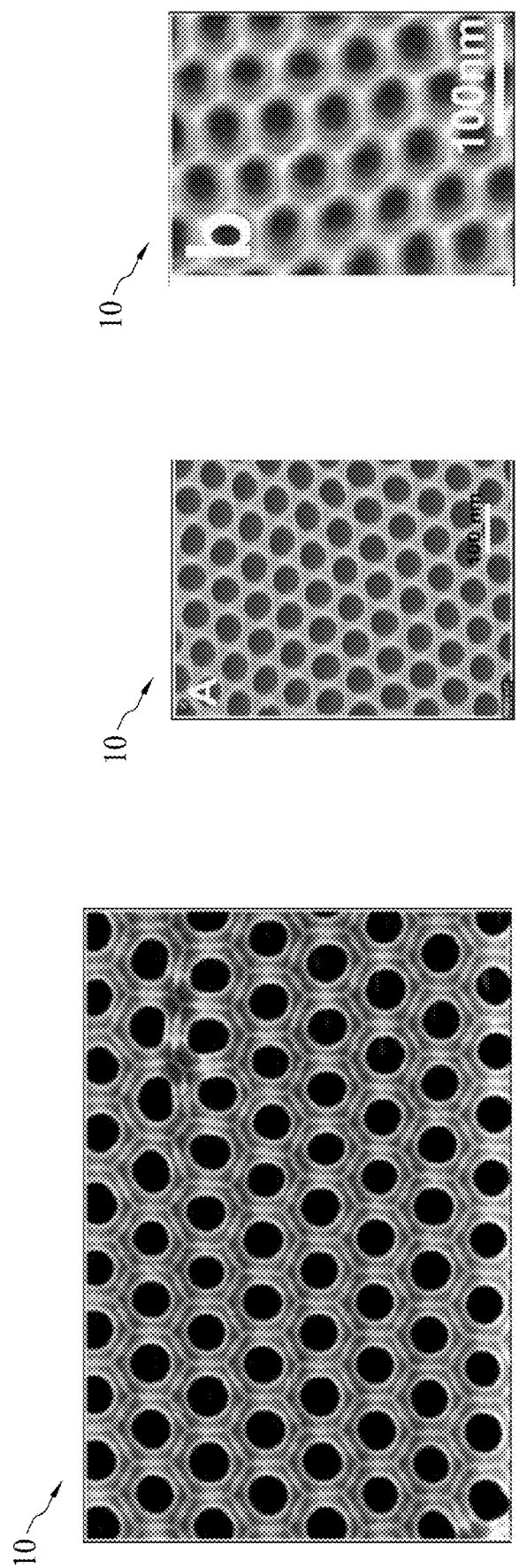

FILTER APPARATUS FOR SEMICONDUCTOR DEVICE FABRICATION PROCESS

RELATED APPLICATIONS

This application claims priority to U.S. Provisional Patent Application No. 63/028,626 filed on May 22, 2020, the entire content of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. As pattern sizes of semiconductor devices become smaller and semiconductor devices having new structures are developed, contaminant-free or particle-free liquids have been required for fabricating integrated circuits to improve yield. Filters, in particular, point-of-use (POU) filters, are designed to remove contaminants or particles from the liquids, solutions, and/or solvents used in semiconductor integrated circuit manufacturing processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1F, 1G, 1H and 1I show views of filter membranes according to various embodiments of the disclosure.

DETAILED DESCRIPTION

Figure 1C:
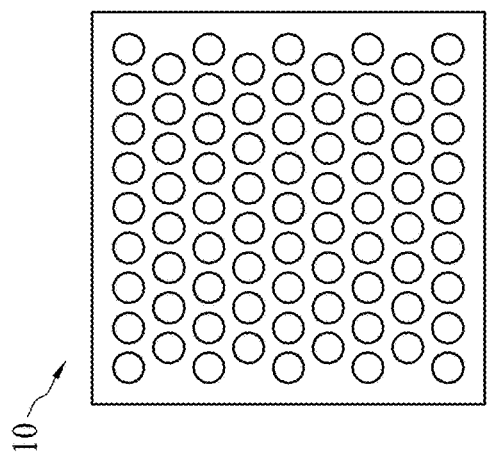
FIGS. 1A, 1B and 1C show schematic views of filter membranes according to various embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Materials, configurations, dimensions and/or processes explained in one embodiments can be applied to other embodiments, and the detailed description thereof may be omitted.

Various fluids, liquids or solutions, such as a photoresist, a developer, a wet etchant, a cleaning solution, a slurry for chemical mechanical polishing, etc., are used in the fabrication of integrated circuits. These fluids are required to be substantially free from contamination and/or particles. Filters are used to remove the contamination and/or particles. In particular, point-of-use filters are designed as the last opportunity to remove contaminants from the fluids used in integrated circuit manufacture. A point-of-use filter processes fluid which is to be utilized immediately in a localized manufacturing step. The manufacture of integrated circuits involves multiple steps in which silicon wafers are repeatedly exposed to processes such as lithography, etching, doping, and deposition of metals. Throughout all of these steps, the semiconductive nature of the silicon and its surface must be maintained and/or specifically controlled. Contamination can alter the semiconductive nature of the silicon or disturb the intended circuit design, thereby reducing the yield of integrated circuits. Particles as small as 0.1 micrometer may, therefore, lead to failure of a semiconductor element. A particle can prevent the completion of a line or a particle can bridge across two lines. Contamination can be either direct on the silicon surface or it may be a contamination of a masking surface, changing the circuit design which is printed. Point-of-use filters must, therefore, remove particulates that would cause defects.

A filter used in the semiconductor fabrication process generally includes a membrane made of fibers. However, pores of the fiber membrane may have random shapes and sizes, and thus may pass some particles through the fiber membrane filter. In some case, a fiber membrane having an average pore size of 7 nm may pass particles of more than about 26 nm.

Embodiments of the disclosure are directed to a filter membrane made of ceramic, such as aluminum oxide, having substantially uniform pore size and various method of manufacturing the filter membrane.

Figure 1B:
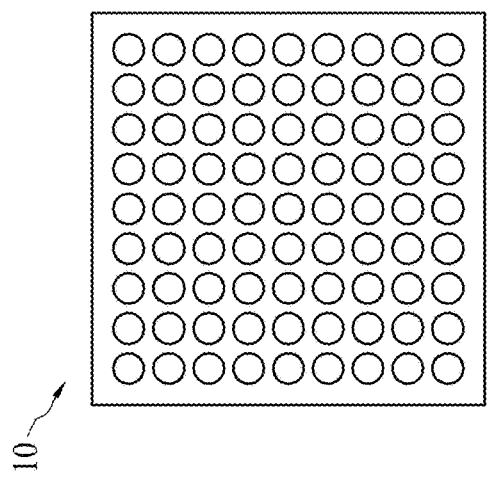
Figure 1A:
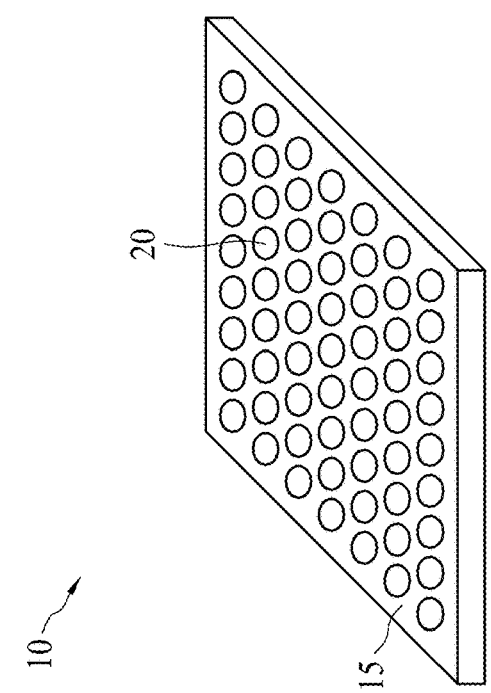
Figure 1F:
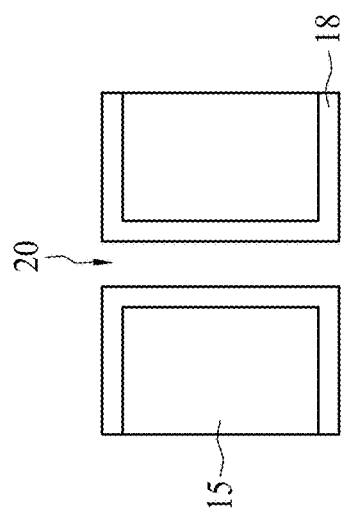
FIGS. 1D, 1E and 1F show various cross sectional views of the filter membranes according to embodiments of the disclosure.
Figure 1E:
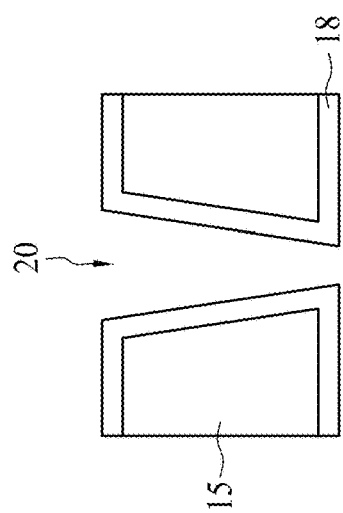
Figure 1D:
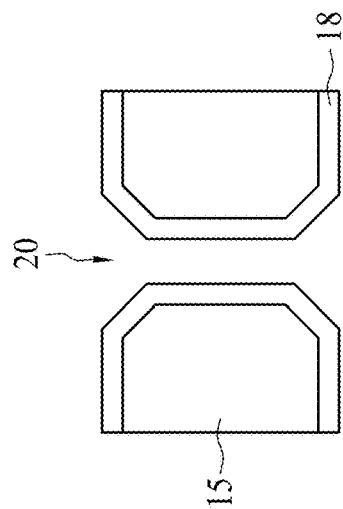

In some embodiments, as shown in FIG. 1A, the filter membrane 10 includes a base membrane 15 and a plurality of through holes 20 (pores) passing through the base membrane 15. FIGS. 1D-1F show cross sectional views of the through hole 20 according to various embodiments of the present disclosure. In some embodiments, a filter membrane is coated with a coating material 18 as shown in FIGS. 1D-1F.

As illustrated in FIG. 1A, when viewed in a thickness direction from a top opening of the through hole, at least a part of the bottom opening can be seen. Thus, filter membranes according to embodiments of the disclosure have a different through path than the through path in a fiber based filter membrane. In some embodiments, the shape of the plurality of through holes 20 is substantially circular or oval. In other embodiments, the shape of the through holes is a square, a rectangle (e.g., slit) or a polygon (e.g., hexagon).

In some embodiments, the diameter of the plurality of circular through holes 20 with the coating material 18 is in a range from about 10 nm to about 500 nm, and in a range from about 50 nm to about 200 nm in other embodiments. When the shape of the through holes 20 is not circular, the average of the largest diameter and the smallest diameter can be considered as the diameter. Variation of the diameters (e.g., three sigma (3σ) value) of the through holes 20 is in a range from about 5% to about 25% of the average diameter in some embodiments, and is in a range from about 10% to about 20% in other embodiments. In some embodiments, the variation (uniformity) of the diameters can be calculated based on 10-50 hole measurements within the filter membrane 10. In this disclosure, the filter membrane 10 having substantially uniform hole diameters as set forth above may be referred to as a homogeneous filter membrane. Further, a filter membrane having random hole sizes (e.g., the variation of the diameters more than 30%) may be referred to as a heterogeneous filter membrane. The diameter of the through holes 20 is set based on a size of particles to be removed and/or a flow conductance of the filter membrane. If the size of the through holes 20 is too large, it may not be possible to remove the particles effectively, and if the size of the through holes 20 is too small, the solution or liquid to be filtered may not flow smoothly through the filter membrane 10.

In some embodiments, the total number of the through holes 20 per unit area (e.g., per square micron) is in a range from about 100 to about 600 and is in a range from about 200 to about 400 in other embodiments. If the number of the through holes per unit area is too small, the solution or liquid to be filtered may not flow smoothly through the filter membrane 10. If the total number of through holes per unit area is too large, the strength of the filter membrane 10 decreases and the filter membrane may be easily broken.

In some embodiments, the plurality of through holes 20 are arranged in a matrix. In some embodiments, the matrix of the through holes is a grid pattern as shown in FIG. 1B. In other embodiments, the matrix of the through holes is a staggered pattern, as shown in FIG. 1C, where most of the through holes 20 are immediately adjacent to six other through holes 20. In some embodiments, when the through holes 20 have a square or a rectangular shape, the filter membrane 10 has a mesh structure. In some embodiments, when the through holes 20 have a hexagonal shape, the filter membrane 10 has a honeycomb shape. In other embodiments, the through holes 20 are arranged in a concentric circular arrangement. In some embodiments, the pitch of the through holes 20 is in a range from about 40 nm to about 100 nm, and is in a range from about 50 nm to about 70 nm in other embodiments. If the pitch is too large, the total number of the through holes 20 per unit area is too small, and the solution or liquid to be filtered may not flow smoothly through the filter membrane 10. If the pitch of too small, the strength of the filter membrane 10 decreases and the filter membrane 10 may be broken easily.

In some embodiments, the thickness of the base membrane 15 is in a range from about 50 nm to about 500 nm, and is in a range from about 100 nm to about 200 nm in other embodiments. If the thickness is too large, it becomes more difficult to make the through holes 20, and it the thickness is too small, the strength of the filter membrane 10 decreases and the filter membrane 10 may be easily broken. In some embodiments, the thickness of the base membrane 15 is greater when the size of the holes 20 is larger. In some embodiments, an aspect ratio (the thickness of the membrane 15 (depth of the hole 20) to the diameter of the hole 20) is in a range from about 1 to about 100 in some embodiments and is in a range from about 2 to about 10 in other embodiments. In some embodiments, the thickness of the base membrane 15 is not uniform, and has a variation in a range of 1-5%.

In some embodiments, the shape or the area of the filter membrane 10 is a square, a rectangle, a polygon, or a circle. In some embodiments, as shown in FIG. 1D, the through hole 20 has a straight cross section (rectangular cross section). In other embodiments, as shown in FIG. 1E, the through holes 20 have a tapered cross section having a larger opening at one side than the other side. In some embodiments, the taper angle is more than about 80 degrees and less than 90 degrees with respect to the horizontal plane (e.g., the surface of the base membrane). When the through hole 20 has a tapered shape, the diameter of the through hole is defined as the smaller openings at the front or the back surfaces. In certain embodiments, the through hole 20 has chamfered edges at the top edge and/or the bottom edge, as shown in FIG. 1F. The thickness of the each of chamfered portions is about 2-10% of the total thickness of the base membrane 15. The tapered shape as shown in FIG. 1E and the chamfered shape shown in FIG. 1F are combined in some embodiments. When the through hole 20 has a chamfered shape, the diameter of the through hole is defined as the diameter at the center of the thickness of the base membrane.

In some embodiments, the material of the base membrane 15 is made of an inorganic material including a ceramic material, such as aluminum oxide, silicon nitride, or silicon carbide, or a glass material. In some embodiments, an anodic aluminum oxide is used as the base membrane. An anodic aluminum oxide is a self-organized form of aluminum oxide that has a honeycomb-like structure formed by high density arrays of uniform and parallel pores. In other embodiments, a ceramic plate is patterned by using one or more lithography and etching operations. The lithography operation may include a laser interference lithography process, an electron beam lithography process or an extreme ultra violet (EUV) lithography process.

The variation of the diameters (e.g., three sigma ($3\sigma$) value) of the through holes 20 before the coating material 18 is formed is in a range from about 5% to about 25% of the average diameter in some embodiments, and is in a range from about 10% to about 20% in other embodiments.

In some embodiments, the coating material 18 is an organic polymer, such as a fluorocarbon polymer, or any other suitable material having a higher acid or alkaline resistance than anodic aluminum oxide. In some embodiments, the organic polymer is a thermoplastic resin. In some embodiments, the organic polymer includes one or more of a polyethylene (PE), a PTFE (polytetrafluoroethylene), a PVDF (polyvinylidene fluoride), a PFA (polyfluoroalkoxy), HDPE (high density polyethylene), a PAS (polyarylsulfone), a PES (polyether sulfone), a PS (polysulfone), a PP (polyproplyene) and a PEEK (polyetheretherketone), or derivatives thereof. In some embodiments, the coating material 18 is a silicone polymer In other embodiments, the coating material 18 is made of an inorganic material, such as silicon oxide (glass), silicon nitride, boron nitride, titanium oxide, or any other suitable material having a higher acid or alkaline resistance than anodic aluminum oxide.

In some embodiments, the coating material 18 is used to improve acid and alkali resistance of the filter membrane. In some embodiments, the coating material is formed by a deposition method, such as chemical vapor deposition (CVD), physical vapor deposition (PVD) including sputtering, or any other suitable deposition method. In other embodiments, the coating material is formed by a spin-coating method. In some embodiments, the thickness of the coating material on the main surface of the base membrane 15 is in a range from about 10 nm to about 1000 nm and is in a range from about 50 nm to 500 nm in other embodiments. In some embodiments, the thickness of the coating material on the main surfaces of the base membrane 15 is not uniform, and has a variation in a range of 1-10%.

In some embodiments, the thickness of the coating material on the inner sidewalls of the through holes 20 is smaller than the thickness of the coating material on the main surfaces of the base membrane 15. In some embodiments, the thickness of the coating material on the inner sidewalls of the through holes 20 is about 10-50% smaller than the thickness of the coating material on the main surfaces of the base membrane 15.

In some embodiments, the thickness of the coating material on the inner sidewalls of the through holes 20 is in a range from about 5 nm to about 500 nm and is in a range from about 10 nm to 100 nm in other embodiments. In some embodiments, the coating material reduces the diameter of the holes 20 by about 10 nm to about 200 nm. In some embodiments, the thickness of the coating material on the inner sidewalls of the through holes 20 is not uniform, and has a variation in a range of 5-20%, which is greater than the variation in thickness on the main surfaces. By adjusting the thickness of the coating material 18, it is possible to adjust the size of the through holes.

FIGS. 1G-1I show scanning electron microscope (SEM) images of the filter membrane 10 according to the present disclosure. FIG. 1G show the filter membrane 10 having the average hole diameter of about 200 nm, FIG. 1H show the filter membrane 10 having the average hole diameter of about 100 nm, and FIG. 1I show the filter membrane 10 having the average hole diameter of about 50 nm.

Figure 2B:
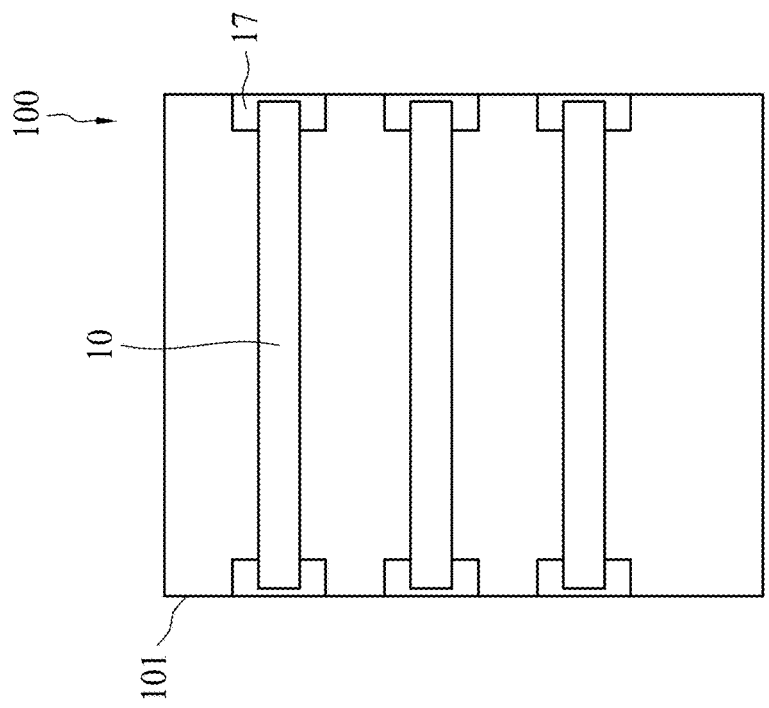
FIGS. 2A and 2B illustrate schematic views of a filter device according to embodiments of the present disclosure.
Figure 2A:
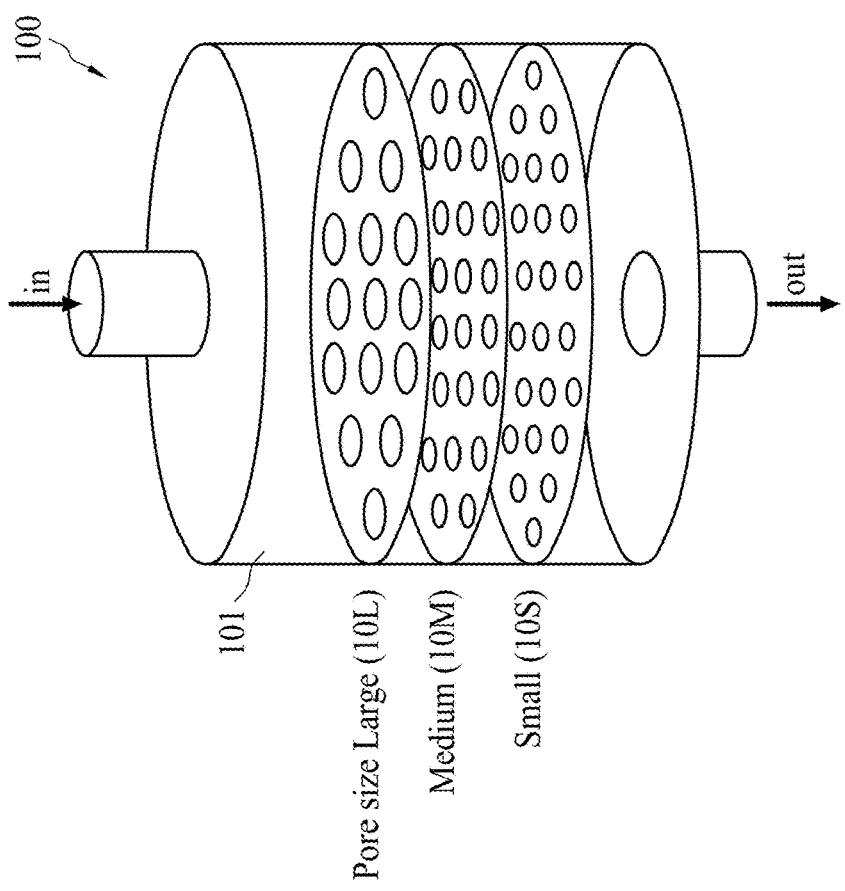

FIG. 2A shows a filter device 100 according to an embodiment of the present disclosure. In some embodiments, one or more filter membranes, as set forth above, are disposed in a filter body (housing) 101 of the filter device 100. In some embodiments, the housing 101 is a cylindrical and the filter membranes have a disk shape. In some embodiments, only one filter membrane is used, and in other embodiments, multiple filter membranes having the same or different average hole diameters. In some embodiments, the filter membranes have the same average diameters (designed diameter) and in other embodiments, the filter membranes have two or more different average diameters. In some embodiments, when the filter membranes have different average diameters, for example, a filter membrane 10L having a large size diameter, a filter membrane 10M having a medium size diameter and a filter membrane 10S having a small size diameter, the large size filter membrane 10L is placed upstream of the solution flow, and the small size filter membrane 10S is placed downstream of the solution flow, as shown in FIG. 2A. In some embodiments, the smallest hole (pore) size is smaller than a target size of particles to be removed. In some embodiments, the difference in size between adjacent filter membranes is about 10%-50%. The sizes of each of the filter membranes is selected based on the process requirements (e.g., target design rules and target particle sized to be removed). The number of the filter membranes in the filter device 100 is in a range from 1 to about 100 in some embodiments, and in other embodiments in a range from 3 to about 10.

In some embodiments, multiple filter membranes are stacked to be in contact with adjacent one of the filter membranes. In other embodiments, the multiple filter membranes are arranged spaced apart from each other. In some embodiments, the space between adjacent filter membranes is in a range from about 1 mm to about 5 cm. In some embodiments, the filter membrane 10 is detachable from the filter device 100.

In some embodiments, multiple filter devices 100 each including one or more filter membrane having the same average diameter but having a different diameter from the other filter devices are connected in series. When the through holes 20 have a tapered shape, the side having a larger opening diameter is arranged at the upstream side of the solution flow in some embodiments.

In some embodiments, as shown in FIG. 2B, the filter membrane 10 is attached the filter housing via a connection member 17. In some embodiments, the connection member 17 is configured to fluid tightly attach the filter membrane 10 to the filter housing 101 so that fluid must pass through the filter membrane 10, and not around the filter membrane 10. In some embodiments, the connection member 17 is made of a synthetic rubber or a fluorine-containing polymer.

In some embodiments, the filter device 100 is used in the vertical direction as shown in FIG. 2A (flow direction is vertical), and in other embodiments, the filter device 100 is used in the horizontal direction (flow direction is horizontal). The flow direction is up to down in some embodiments as shown in FIG. 2A, and in other embodiments, the flow direction is bottom to top. Depending on the flow directions, the order of filter membranes may be changed.

Figure 2E:
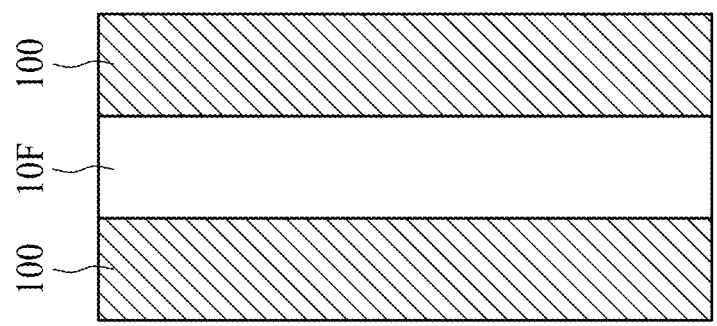
FIGS. 2C, 2D, 2E, 2F, 2G and 2H show various filter structures according to embodiments of the present disclosure.
Figure 2D:
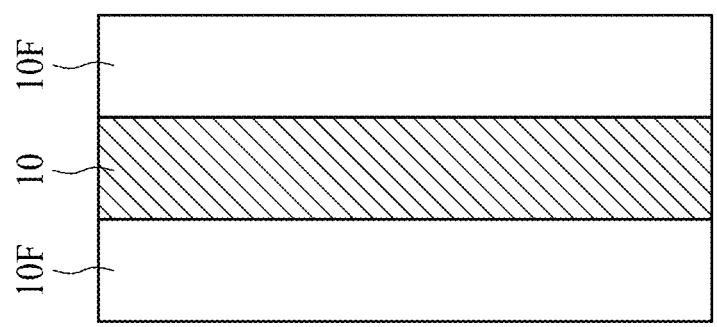
Figure 2C:
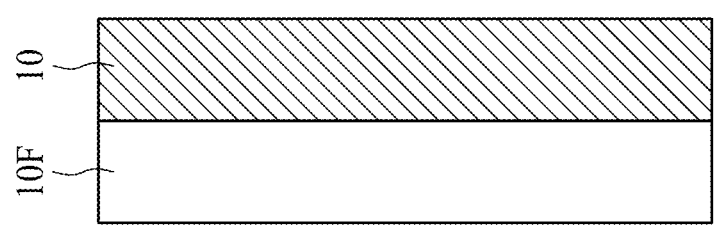

In some embodiments, the filter membrane 10 is used alone or used with another type of filter membrane, as shown in FIGS. 2C, 2D and 2E. In some embodiments, the filter membrane 10 according to the present embodiments is used with a heterogeneous filter membrane 10F. In some embodiments, the heterogeneous membrane 10F includes a ceramic based filter membrane having random hole sizes or a fiber-based filter membrane. In some embodiments, the heterogeneous membrane 10F is attached to the front and/or rear surface of the filter membrane 10, as shown in FIGS. 2C and 2D. In other embodiments, the filter membranes 10 are attached to the front and rear surface of the heterogeneous membrane 10F, as shown in FIG. 2E. In some embodiments, the filter membrane 10 is attached to part of the fiber-based filter membrane.

Figure 2H:
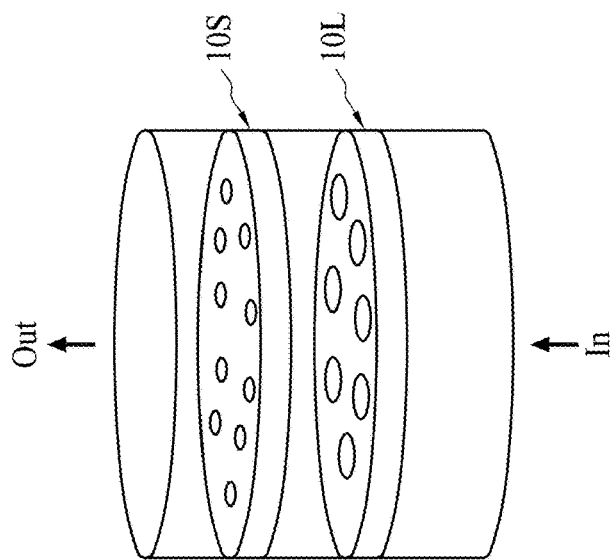
Figure 2G:
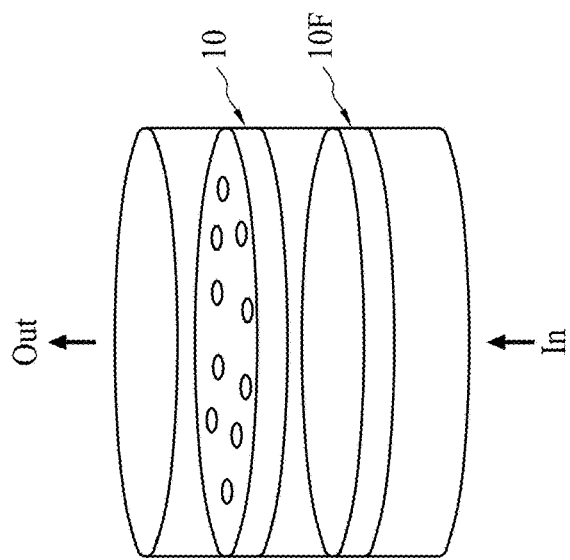
Figure 2F:
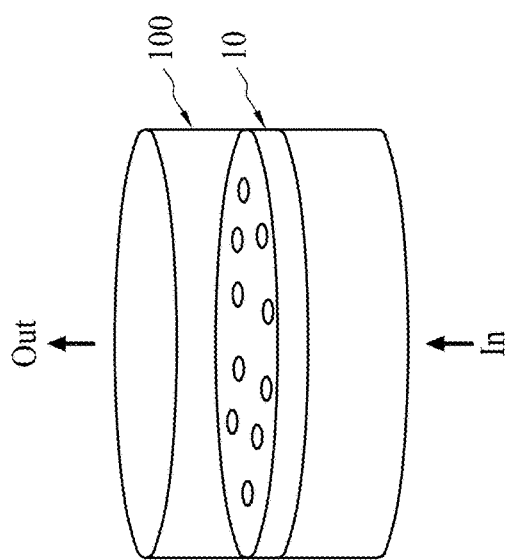

FIG. 2F is a filter device 100 according to one embodiment of the present disclosure. In this embodiment, one filter membrane 10 is used and the flow direction is bottom to top. FIG. 2G is a filter device 100 according to one embodiment of the present disclosure. In this embodiments, one or more heterogeneous filter membranes 10F and one or more homogeneous filter membranes 10 are used. The flow direction is bottom to top in some embodiments, and the heterogeneous filter membrane 10F is located at an upstream side. FIG. 2H is a filter device 100 according to one embodiment of the present disclosure. In this embodiments, two homogeneous filter membranes having different hole diameters 10S and 10L are used similar to FIG. 2A. The flow direction is bottom to top in some embodiments, and the large hole size filter membrane 10L is located at an upstream side.

Figure 3B:
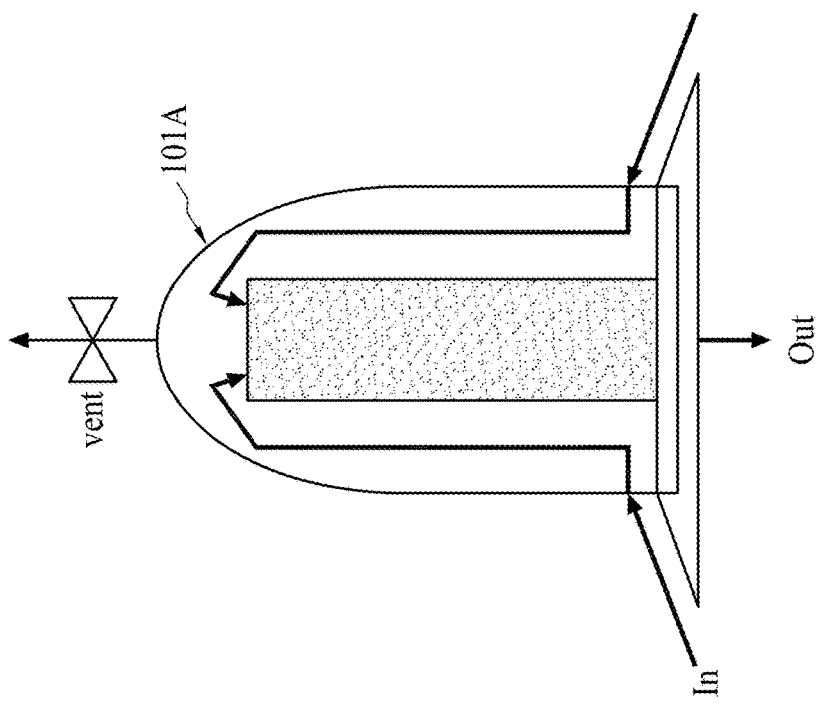
FIGS. 3A, 3B, 3C, 3D and 3E illustrate schematic views of a filter device according to embodiments of the present disclosure.
Figure 3A:
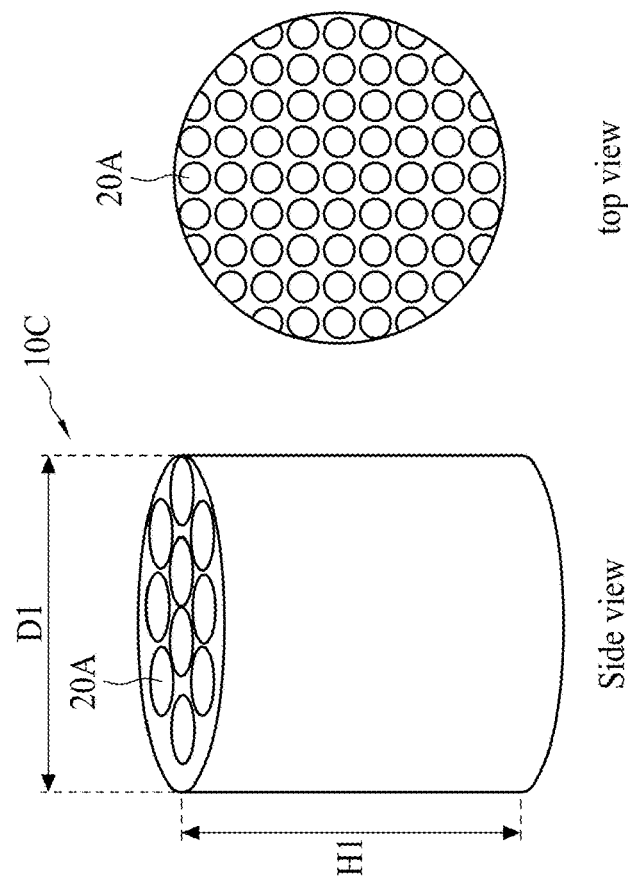

FIG. 3A is a filter membrane according to embodiments of the present disclosure. Materials, processes, dimensions and/or configurations described with respect to the foregoing embodiments can be applied to the following embodiments, and the detailed description thereof may be omitted.

As shown in FIG. 3A, the filer membrane 10C has a cylindrical shape having a plurality of through holes 20A and having a height H1 and an outer diameter D1. In some embodiments, the height H1 is in a range from about 10 μm to about 100 μm. In some embodiments, an aspect ratio H1/D1 is equal to or more than 0.01 and less than about 10. In other embodiments, H1/D1 is in a range from about 0.1 to about 5. In the case of a disk shape filter membranes (e.g., 10L, 10M, 10S), the aspect ratio is smaller than 0.01 and more than zero. The cylindrical filter membrane 10C includes a plurality of through holes 20A similar to or same as the filter membrane 10 as explained above. In some embodiments, the cylindrical filter membrane 10C is a homogeneous filter membrane. In some embodiments, the diameter of the through holes 20A are in a range from about 100 nm to about 500 nm. The aspect ratio of the through holes is in a range from about 20 to about 1000. The horizontal cross sectional shape of the through holes is circular, oval, hexagonal, square or other regular or irregular shapes.

In some embodiments, the cylindrical filter membrane 10C is accommodated in the filter housing 101A, as shown in FIG. 3B. In some embodiments, the solution to be filtered flows into the filter housing 101A from a bottom portion, and flown into the cylindrical membrane 10C (through holes) from the top. The filtered solution flows out from the housing 101A at the bottom of the housing. In some embodiments, a vent with a valve is provided at the top of the filter housing 101A.

Figure 3E:
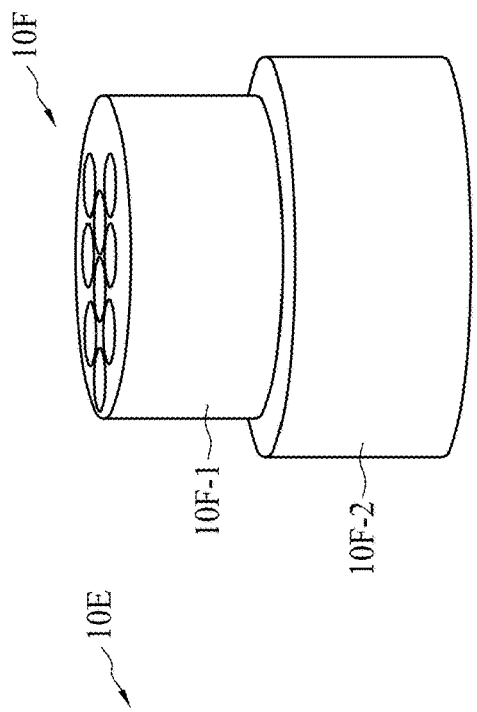
Figure 3D:
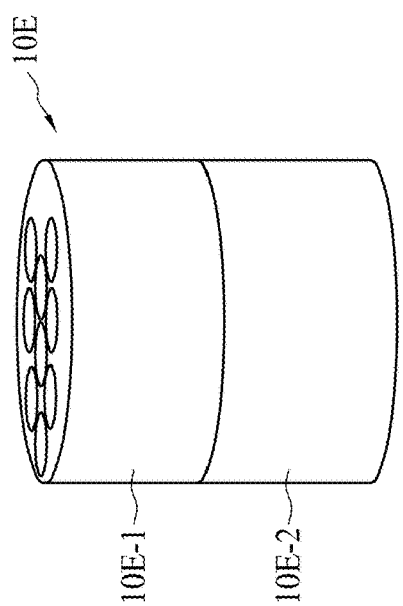
Figure 3C:
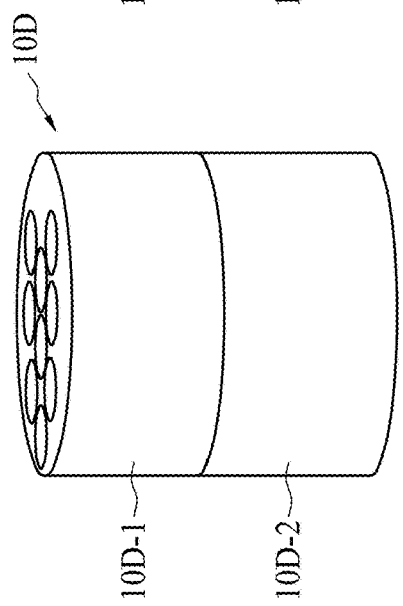

FIG. 3C shows a stacked cylindrical filter membrane 10D. The stacked cylindrical filter membrane 10D includes two or more cylindrical filter membranes 10D-1 and 10D-2 each corresponding to a cylindrical filter membrane 10C. In some embodiments, the diameter of the through holes of the upper cylindrical filter membrane 10D-1 is greater than the diameter of the through holes of the lower cylindrical filter membrane 10D-2. The number of cylindrical filter membranes may be 3, 4 or 5 in some embodiments.

FIG. 3D shows a stacked cylindrical filter membrane 10E. The stacked filter membrane 10E includes one or more cylindrical filter membranes 10E-1 each corresponding to a cylindrical filter membrane 10C and one or more heterogeneous filter membrane (e.g., fiber based membrane) 10E-2. In some embodiments, the heterogeneous filter membrane 10E-2 is located closer to the outlet than the homogeneous filter membrane 10E-1.

FIG. 3E shows a stacked cylindrical filter membrane 10F. In some embodiments, an upper filter membrane 10E-1 has a smaller cylinder diameter than the lower filter membrane 10E-2. In some embodiments, the upper filter membrane 10E-1 corresponds to a cylindrical filter membrane 10C, and the lower filter membrane 10E-2 corresponds to a heterogeneous filter membrane.

Figure 4:
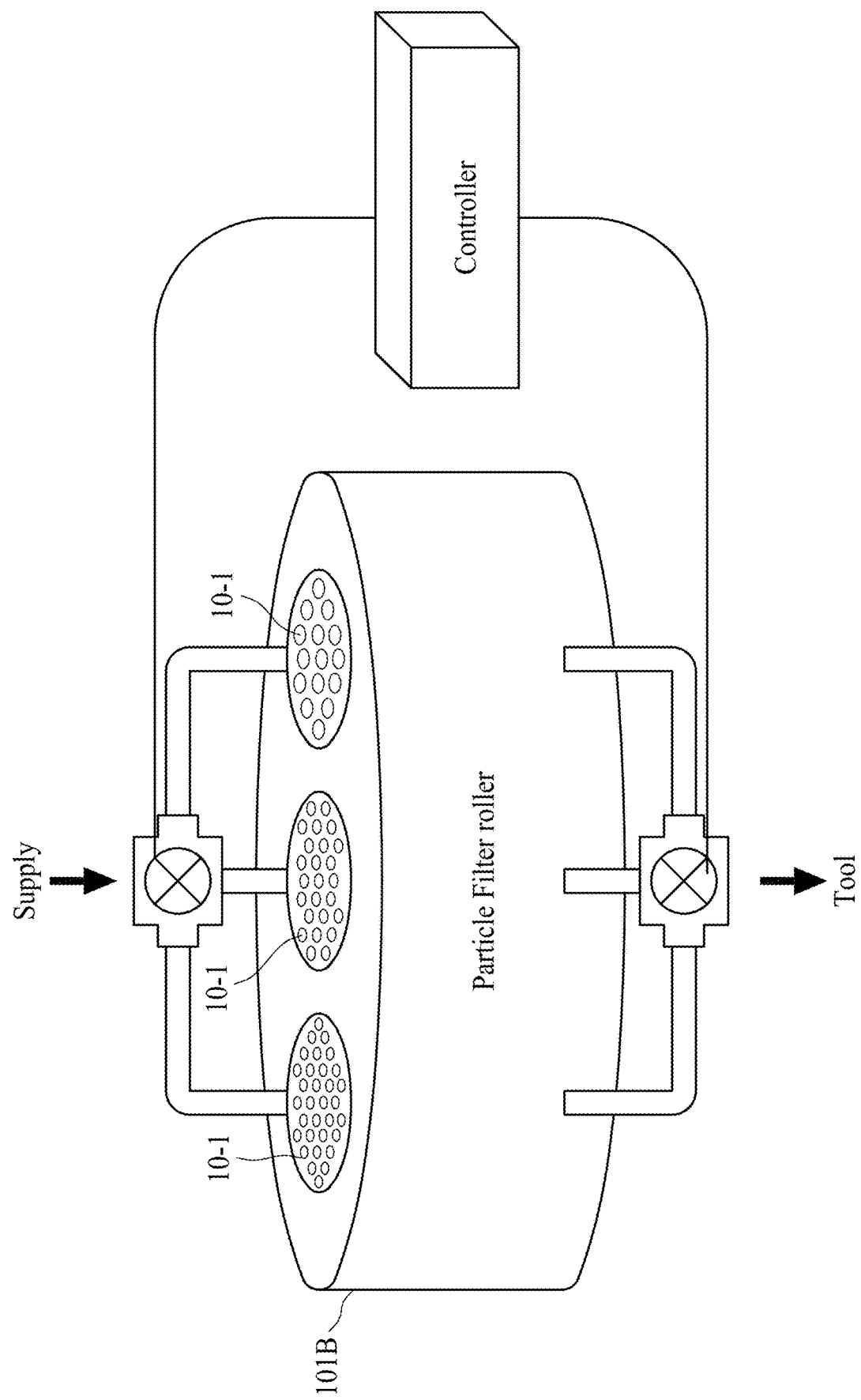
FIG. 4 shows a schematic view of a filter device according to an embodiment of the present disclosure.

FIG. 4 shows a schematic view of a filter device according to an embodiment of the present disclosure. In some embodiments, two or more filter membrane (plate shape or cylindrical shape) are selectively used. In some embodiments, a filter housing 101B accommodates multiple (e.g., three) filter membranes 10-1, 10-2 and 10-3 having different through holes. In some embodiments, one or more, but not all, of the filter membranes are a heterogeneous filter membrane. Each of the filter membranes is connected to a switching valve at the inlet side and/or the outlet side, and the switching valve is controlled by a controller as shown in FIG. 4. The controller selects a suitable filter membrane depending on the use of the solution (e.g., CMP slurry).

Figure 5:
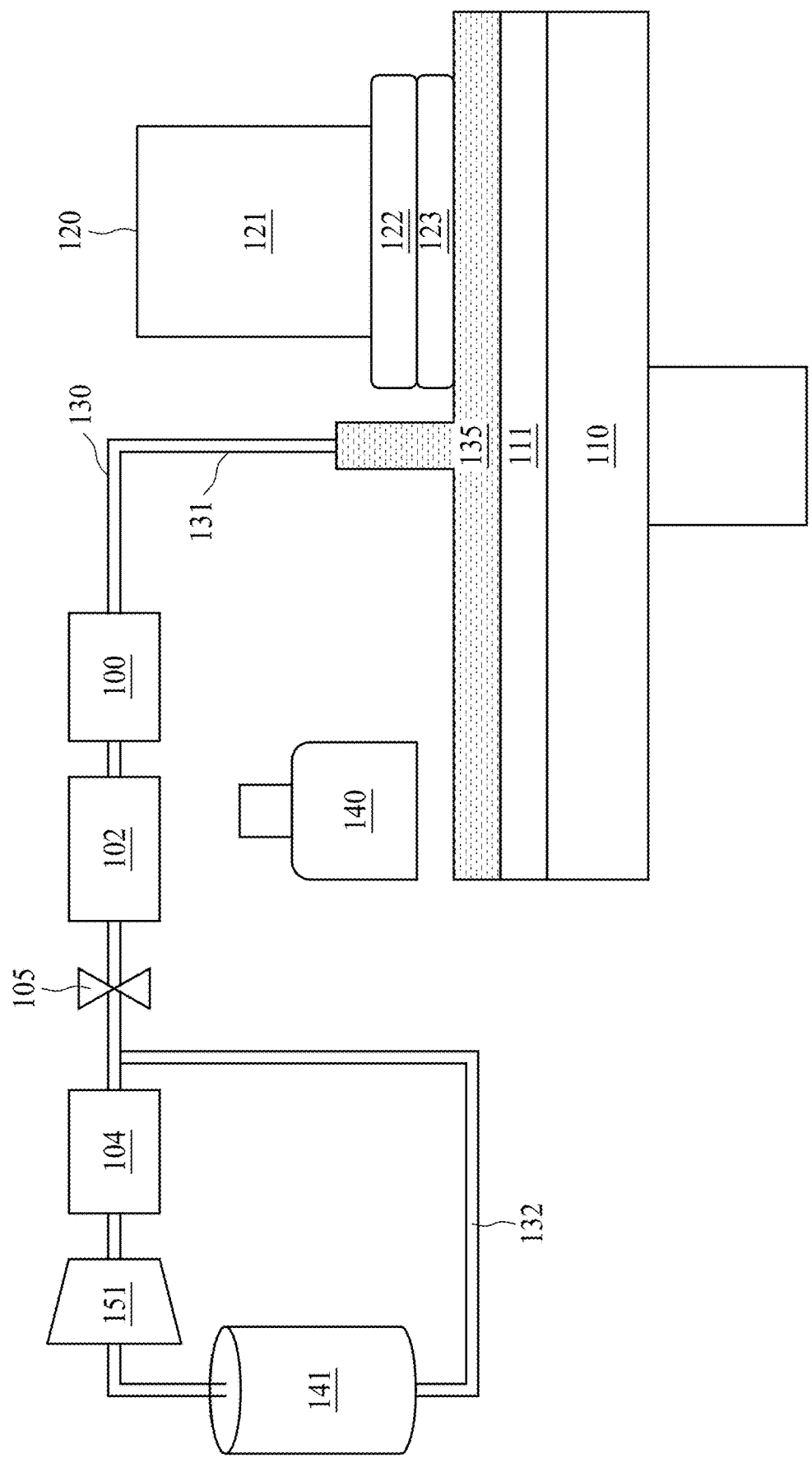
FIG. 5 shows a schematic view of a chemical mechanical polishing apparatus using the filter device of the present disclosure.

FIG. 5 shows an application of the filter device 100 using the filter membrane 10 according to embodiments of the present disclosure. FIG. 5 shows a chemical mechanical polishing (CMP) apparatus for manufacturing a semiconductor device. In some embodiments, the CMP apparatus includes a rotatable platen 110, a polishing head assembly 120, a chemical slurry supply system 130, and a pad conditioner 140. In some embodiments, the platen 110 is connected to a motor (not shown) which rotates the platen 110 at a preselected rotational velocity. In some embodiments, the platen 110 is covered with a replaceable polishing pad 111 of a relatively soft material. In some embodiments, the pad 111 is a thin polymeric disc with a grooved surface, and can be porous or solid, depending on the application. Factors determining the material and physical properties of the pad 111 include the material to be polished (i.e., material at the wafer surface), and the desired roughness after polishing. The pad 111 may have a pressure sensitive adhesive on the back so that the pad 111 adheres to the platen 110. During the polishing process, the pad may be wetted with a suitable lubricant material, depending on the type of material being polished (i.e., the material at the top surface of the wafer). In an embodiment, the polishing head assembly 120 includes a head 121 and a carrier 122. The head 121 holds the carrier 122 which in turn holds a wafer 123 to be polished. In some embodiments, the head 121 may include a motor for rotating the wafer 123 relative to the platen 110. In some embodiments, the wafer 123 and the platen 110 are rotated in an asynchronous non-concentric pattern to provide a non-uniform relative motion between the platen 110 and the wafer 123. The assembly 120 applies a controlled downward pressure to the wafer 123 to hold the wafer 123 against the platen 110.

The slurry supply system 130 introduces a chemical slurry 135 of a suitable material to be used as an abrasive medium between the pad 111 and the wafer 123. In an embodiment, the slurry 135 is a colloid of abrasive particles dispersed in water with other chemicals such as rust inhibitors and bases to provide an alkaline pH. In some embodiments, the abrasive particles are made of materials such as, for example, silica, ceria, and alumina. In an embodiment, the abrasive particles have a generally uniform shape and a narrow size distribution, with an average particle size ranging from about 10 nm to about 100 nm or more depending on the application for which it is being used.

The slurry used in the CMP operation is an abrasive solution containing active chemicals and abrasive agents that act to passivate, chemically attack and polish the surface of a wafer. One of the problems in the CMP operation is on-wafer scratches that may be caused by large slurry particles, aggregates or slurry agglomerates generated in the mixing or recirculation of the slurry. Such large particles or aggregates are filtered by using one or more filter devices.

In an embodiment, the slurry supply system 130 includes a slurry storage 141 (e.g., tank), a circulation pump 151, a first filter device 104, a valve manifold box 102 and a point-of-use (POU) filter device 100 connected by a conduit 131 for delivering the slurry 135 to the polishing pad 111 atop the platen 110. In some embodiments, the slurry supply system 130 includes a circulation path 132 for circulating the slurry from and to the slurry tank 140. One or more filter devices are disposed on the circulation path 132 in some embodiments, in addition to the first filter 104. In some embodiments, a stop valve 105 is disposed between the valve manifold box and the branching point of the circulation path 132. In some embodiments, multiple slurry tanks are provided and multiple slurry supply systems are coupled to the valve manifold box 102, by which one or more of the slurries is selected for a CMP operation. In some embodiments, multiple circulation paths using multiple filters are used.

In some embodiments, the POU filter device 100 includes the aforementioned filter membrane 10 including the anodic aluminum oxide base coated with a coating material. In other embodiments, the first filter device 104 includes the aforementioned filter membrane 10 including the anodic aluminum oxide base coated with a coating material. In some embodiments, the average pore (hole) size of the filter membrane of the first filter device 104 is equal to or greater than the average pore size of the POU filter device 100. In some embodiments, the first filter device 104 includes a fiber based filter membrane.

In some embodiments, by circulating the slurry within the circulation path 132 (stop valve 105 is turned off (closed)), particles that may exist in the slurry 135 can be filtered by the first filter device 104. When the slurry is used for a CMP operation, the stop valve 105 is turned on (opened), and slurry is supplied to the valve manifold box 102. In some embodiments, the stop valve 105 is a three-way valve that changes the destination of the slurry between the circulation path 132 and the CMP apparatus.

In some embodiments, the valve manifold box 102 includes one or more valves and one or more flow regulators for adjusting a flow rate of the slurry. The slurry is further subjected to filtration by the POU filter device 100. Particles that may exist in the slurry 135 can be filtered by the POU filter device 100, and the filtered slurry is supplied to the pad 111. In some embodiments, filter membranes in the POU filter deice 100 (e.g., the size of the filter membrane) are selected based on a type of slurry, a recipe of a CMP operation, and/or other process requirements.

Figure 6A:
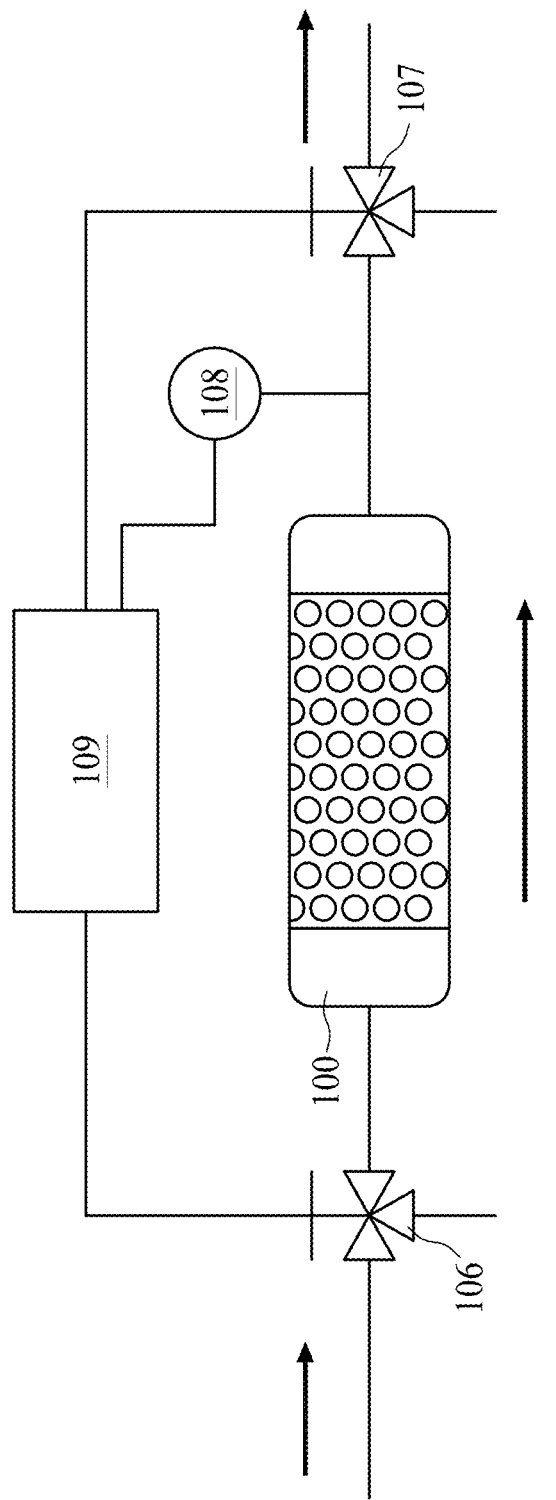
FIGS. 6A, 6B and 6C show a cleaning operation of the filter device according to embodiments of the present disclosure.
Figure 6B:
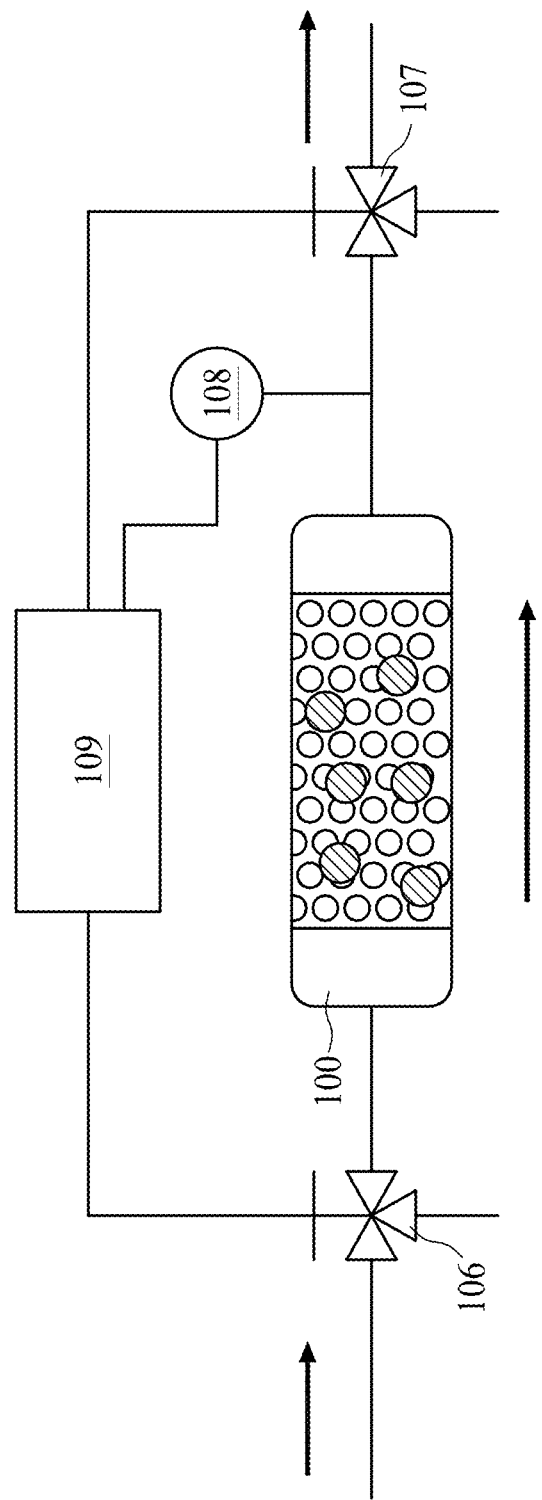
Figure 6C:
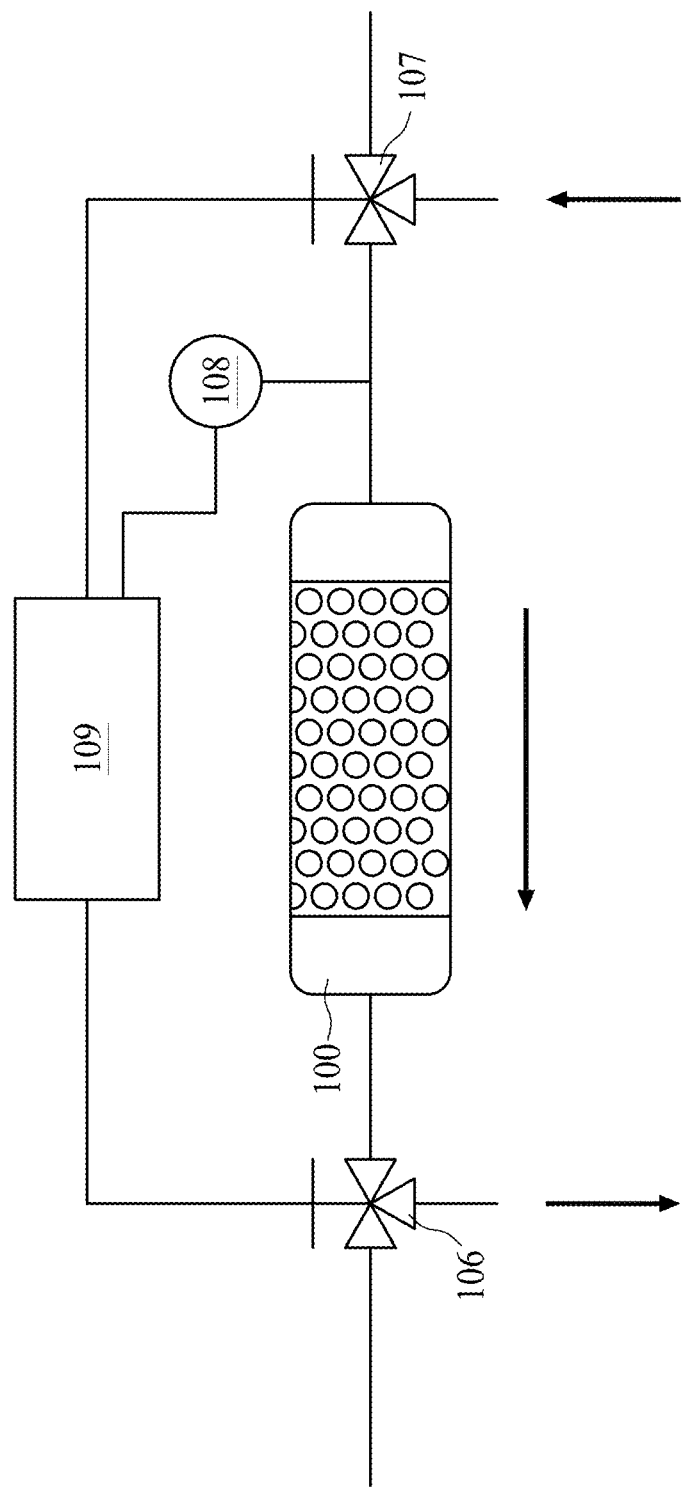

FIGS. 6A, 6B and 6C show a filter cleaning operation according to an embodiment of the present disclosure.

In some embodiments, as shown in FIG. 6A, a first three way valve 106 and a second three way valve 107 are disposed so that the filter device 100 (POU filter) is disposed between the first and second three way valves. Further, a flow rate monitor 108 is disposed at an outlet of the filter device 100. In some embodiments, the flow rate monitor 108 is disposed between the second three way valve 107 and the filter device 100, and in other embodiments, the flow rate monitor 108 is disposed downstream of the second three way valve 107. As shown in FIG. 6A, a controller (control circuitry) 109 is provided to receive a flow amount signal from the flow rate monitor 108 and to control the first and second three way valves. In normal operation, the first and second three way valves are controlled such that the slurry flows through the filter device 100 to the CMP apparatus.

As shown in FIG. 6B, when particles are captured by the filter membrane of the filter device 100, a flow rate of the slurry at the downstream of the filter device 100 decreases. When the flow rate of the slurry decreases below a threshold value, the controller 109 starts a cleaning operation as shown in FIG. 6C.

As shown in FIG. 6C, the controller 109 switches the flow directions of the first three way valve 106 and the second three way valve 107 such that a cleaning solution flows through the filter device backward from the second three way valve 107 to the first three way valve 106. The captured particles and the cleaning solutions are drained from the first three way valve 106. In some embodiments, the cleaning solution is de-ionized water, an organic solvent (acetone, isopropyl alcohol, etc.), an acidic solution and/or an alkaline solution. In some embodiments, a solvent the same as the solvent used for the slurry is used as the cleaning solution. In some embodiments, the cleaning solution is pressurized at 2-10 times the atmospheric pressure. In some embodiments, after the cleaning by the cleaning solution in the backward direction, an additional cleaning by the cleaning solution in the forward direction is performed. The backward and forward direction cleanings are performed multiple times in some embodiments.

After the cleaning operation, the slurry is supplied to the filter device 100. In some embodiments, the three way valve 107 is switched to the drain side for a predetermined time to drain the cleaning solution inside the filter device 100 and flow paths. This operation can be controlled by monitoring the flow rate.

In other embodiments, the cleaning operation is performed periodically without monitoring the flow rate of the slurry. For example, the cleaning operation is performed after N-wafers are processed (N is natural number up to, for example, 25, 100 or 500). In other embodiments, the cleaning operation is performed every M hours (M is natural number up to, for example, 1, 10 or 100).

Figure 7A:
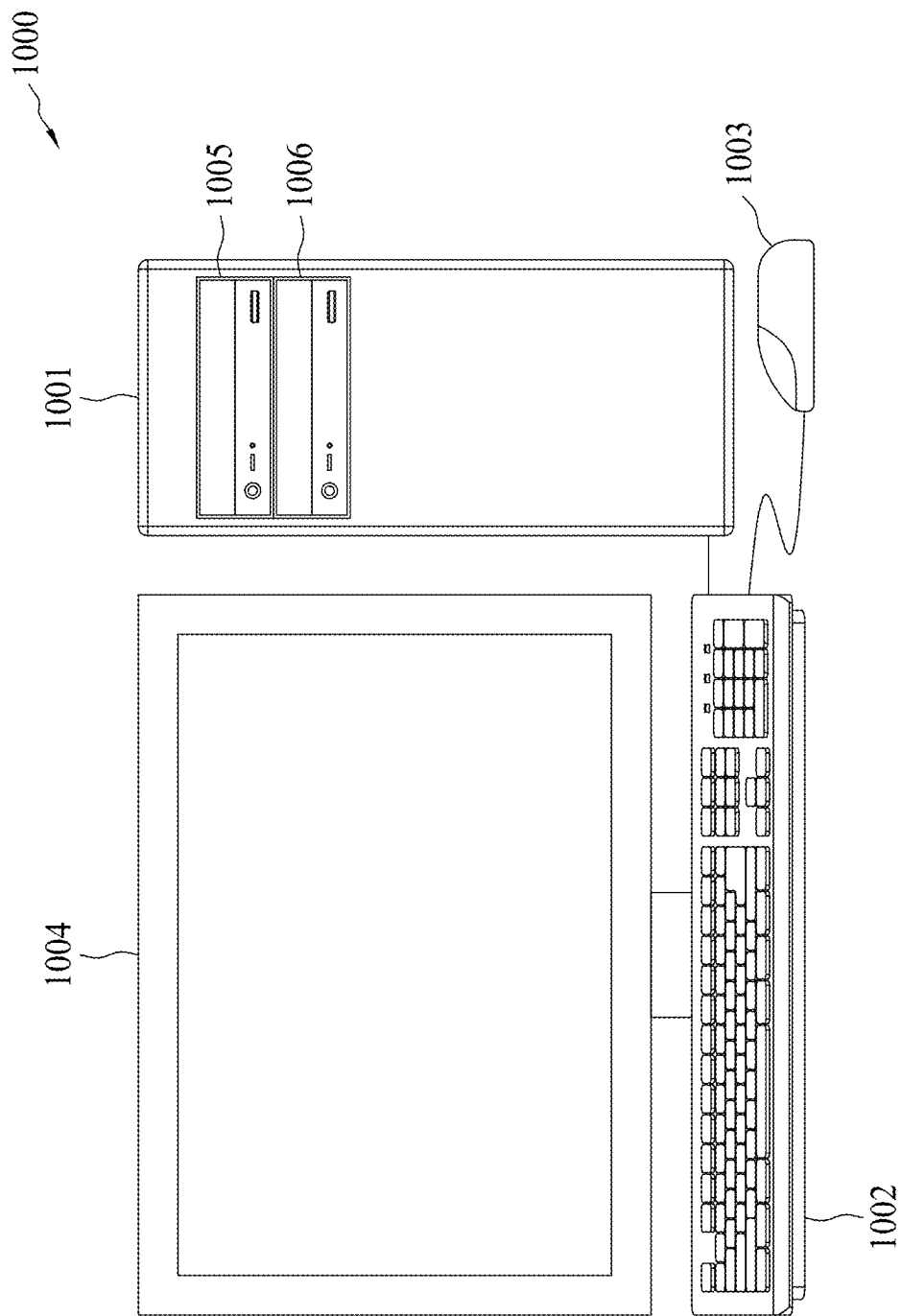
FIGS. 7A and 7B show schematic views of an apparatus for controlling the chemical mechanical polishing (CMP) apparatus.
Figure 7B:
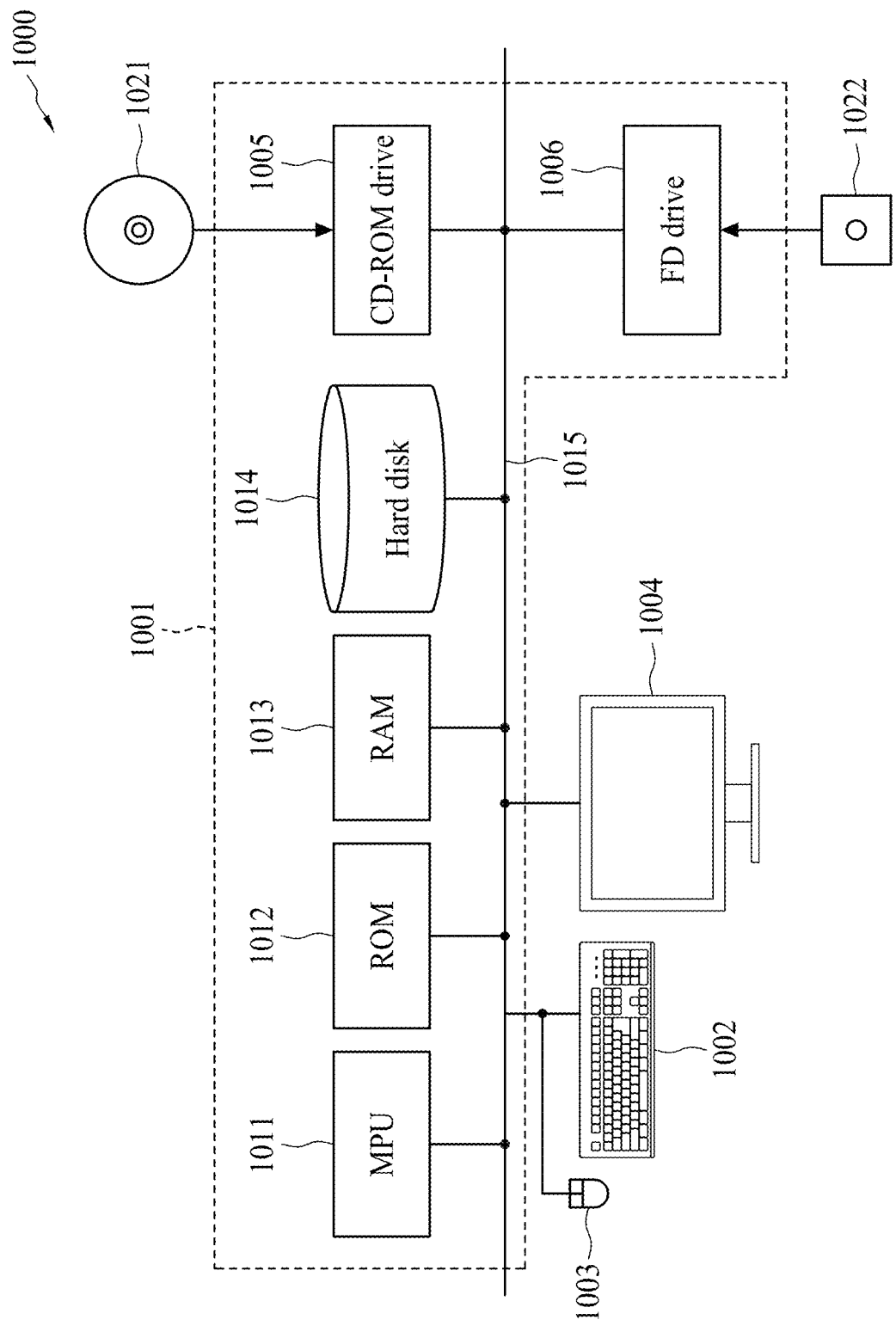

FIGS. 7A and 7B illustrate a configuration of the controller 109 in accordance with some embodiments of the disclosure. In some embodiments, the computer system 1000 is used as the controller 109. In some embodiments, the computer system 1000 performs the functions of the controller as set forth above. In some embodiments, the computer system also controls an operation of the entire CMP apparatus including the slurry supplying system.

FIG. 7A is a schematic view of a computer system. All of or a part of the processes, method and/or operations of the foregoing embodiments can be realized using computer hardware and computer programs executed thereon. In FIG. 7A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 7B is a diagram showing an internal configuration of the computer system 1000. In FIG. 7B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 1000 to execute the functions of an apparatus for controlling the slurry supplying system and/or the CMP apparatus in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the controller 109 in the foregoing embodiments. The program may only include a command portion to call an appropriate function (module) in a controlled mode and obtain desired results.

Figure 8A:
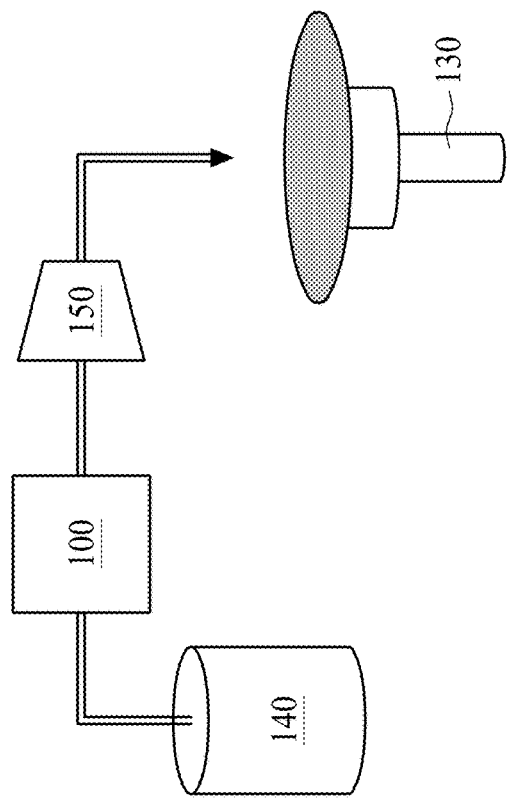
FIGS. 8A and 8B show schematic views of an apparatus using the filter device of the present disclosure.
Figure 8B:
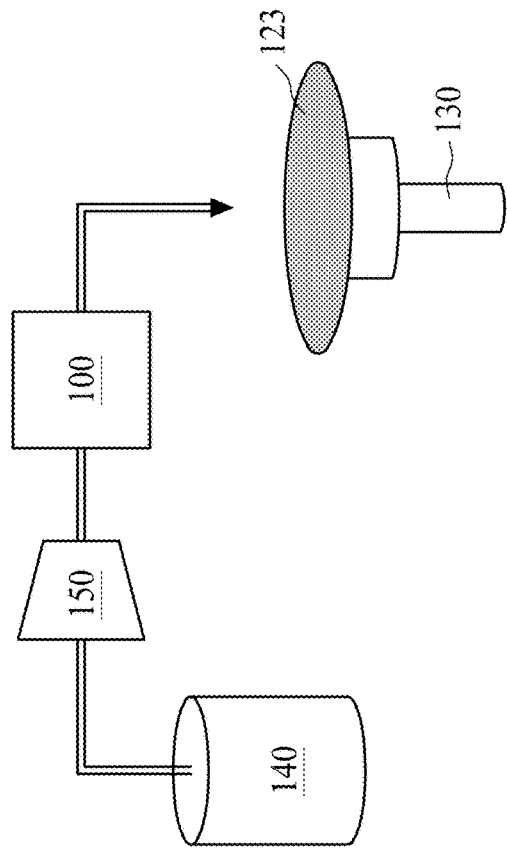

FIGS. 8A and 8B show a liquid or solution supplying system for manufacturing a semiconductor device. In some embodiments, a liquid or solution supplying system is a photo resist coating apparatus, including a photo resist container (e.g., tank or bin) 140, a pump 150 and the filter device 100. In some embodiments, the filter device 100 is disposed downstream of the pump 150 as shown in FIG. 8A, and in other embodiments, the filter device 100 is disposed upstream of the pump 150 as shown in FIG. 8B. As shown in FIGS. 8A and 8B, the photo resist passing through the filter device is supplied on a wafer 123 that is rotated by a wafer rotation mechanism 130. Particles that may exist in the photo resist can be filtered by the filter membrane 10 contained in the filter device 100, and the filtered photo resist is supplied to the wafer 123. In other embodiments, a liquid or solution supplying system is a photo resist developing apparatus, including a developer container (e.g., tank or bin) 140, a pump 150 and the filter device 100. Particles that may exist in the developer can be filtered by the filter membrane 10 contained in the filter device 100 and the filtered developer is supplied to the wafer 123.

In other embodiments, a liquid or solution supplying system is a wafer cleaning or etching apparatus, including a solution container (e.g., tank or bin) 140 for storing a cleaning or etching solution, a pump 150 and the filter device 100. Particles that may exist in the cleaning or wet etching solution can be filtered by the filter membrane 10 contained in the filter device 100 and the filtered developer is supplied to the wafer 123. In some embodiments, the cleaning solution is an aqueous solution of ammonium hydroxide and hydrogen peroxide, an aqueous solution of hydrochloric acid and hydrogen peroxide, an organic solvent (e.g., IPA), or any other cleaning solution used in the fabrication of a semiconductor device. In some embodiments, the wet etching solution includes HF, phosphoric acid or any other wet etchant used in the fabrication of a semiconductor device.

The filter cleaning system and method shown in FIGS. 6A-6C can be applied to the liquid or solution supplying system shown in FIGS. 8A and 8B, In the present embodiments, since uniform through holes are formed in a base membrane in a filter membrane, it is possible to improve the particle capturing rate. Because the base membrane made of anodic aluminum oxide is coated by a coating layer, it is possible to use the filter membrane with an acid or a alkaline solution. Further, because it is easier to control the hole size, various filter membrane having different pore sizes can be effectively and easily used in a filter device.

According to one aspect of the present disclosure, a filter device used in an apparatus for manufacturing a semiconductor device includes one or more filter membranes, and a filter housing enclosing the one or more filter membranes. Each of the filter membranes includes a base membrane made of a ceramic material, and a plurality of through holes, and the base membrane is coated with a coating material. In one or more of the foregoing and following embodiments, an average diameter of the plurality of through holes in in a range from 10 nm to 500 nm. In one or more of the foregoing and following embodiments, a variation of diameters of the plurality of through holes is in a range from 5% to 25% of the average diameter. In one or more of the foregoing and following embodiments, a thickness of the base membrane is in a range from 50 nm to 500 nm. In one or more of the foregoing and following embodiments, an aspect ratio of plurality of through holes is in a range from 2 to 10. In one or more of the foregoing and following embodiments, the coating material includes one or more of PE (polyethylene), PTFE (polytetrafluoroethylene), PVDF (polyvinylidene fluoride), PFA (polyfluoroalkoxy), HDPE (high density polyethylene), PAS (polyarylsulfone), PES(polyether sulfone), PS (polysulfone), PP (polyproplyene) and PEEK (polyetheretherketone), or derivatives thereof. In one or more of the foregoing and following embodiments, the ceramic is anodic aluminum oxide. In one or more of the foregoing and following embodiments, a total number of the plurality of holes per square micron is in a range from 100 to 600. In one or more of the foregoing and following embodiments, two or more filter membranes having different average hole sizes from each other are provided in the filter device. In one or more of the foregoing and following embodiments, the filter housing includes an inlet and an outlet, and a filter membrane having a larger average hole size is located closer to the inlet than a filter membrane having a smaller average hole size.

In accordance with another aspect of the present disclosure, a liquid supplying system includes a semiconductor wafer processing apparatus, a liquid tank configured to store a liquid for manufacturing a semiconductor device, a liquid supply system for supplying the liquid from the liquid tank to the semiconductor wafer processing apparatus, and a point-of-use (POU) filter device disposed on the liquid supply system. The POU filter device includes one or more filter membranes, and a filter housing enclosing the one or more filter membranes. Each of the filter membranes includes a base membrane made of anodic aluminum oxide, and a plurality of through holes, and the base membrane is coated with a coating material. In one or more of the foregoing and following embodiments, an average diameter of the plurality of through holes in in a range from 50 nm to 200 nm. In one or more of the foregoing and following embodiments, a variation of diameters of the plurality of through holes is in a range from 10% to 20% of the average diameter. In one or more of the foregoing and following embodiments, a thickness of the base membrane is in a range from 50 nm to 500 nm. In one or more of the foregoing and following embodiments, the coating material includes one or more of PE (polyethylene), PTFE (polytetrafluoroethylene), PVDF (polyvinylidene fluoride), PFA (polyfluoroalkoxy), HDPE (high density polyethylene), PAS (polyarylsulfone), PES(polyether sulfone), PS (polysulfone), PP (polyproplyene) and PEEK (polyetheretherketone), or derivatives thereof. In one or more of the foregoing and following embodiments, the semiconductor wafer processing apparatus is a chemical mechanical polishing (CMP) apparatus, and the liquid is a CMP slurry. In one or more of the foregoing and following embodiments, the liquid supplying system further includes a circulation path for circulating the liquid from the liquid tank to the liquid tank. The circulation path includes another filter device.

In accordance with another aspect of the present disclosure, in a method of cleaning a filter device, it is determined whether the filter device is to be cleaned or not, and after determining that the filter device is to be cleaned, a cleaning solution is made to flow through the filter device in a reverse direction. The filter device includes a filter membrane, and a filter housing enclosing the filter membrane. The filter membrane includes a base membrane made of anodic aluminum oxide, and a plurality of through holes, and the base membrane is coated with a coating material. In one or more of the foregoing and following embodiments, in the determining, a flow rate of a liquid passing through the filter device is monitored, and it is determined whether the flow rate is below a threshold rate. In one or more of the foregoing and following embodiments, the cleaning solution is water or an organic solvent.

In accordance with another aspect of the present disclosure, in a method of manufacturing a semiconductor device, a liquid is supplied over a semiconductor substrate for a process. The liquid is filtered by a filter device before the liquid reaches the semiconductor wafer. The filter device includes a filter membrane, and a filter housing enclosing the filter membrane. The filter membrane includes a base membrane made of anodic aluminum oxide, and a plurality of through holes, and the base membrane is coated with a coating material. In one or more of the foregoing and following embodiments, the process is a CMP process and the liquid is slurry. In one or more of the foregoing and following embodiments, the process is a wet cleaning or wet etching, and the liquid is one or more of water, acid or alkaline solutions. In one or more of the foregoing and following embodiments, the process is a resist coating, and the liquid is a photo resist. In one or more of the foregoing and following embodiments, the process is a resist development, and the liquid is a TMAH aqueous solution.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A filter device used in an apparatus for manufacturing a semiconductor device, comprising:
   one or more filter membranes; and
   a filter housing enclosing the one or more filter membranes,
   wherein each of the one or more filter membranes includes a base membrane made of a ceramic material, and a plurality of through holes,
   the base membrane is coated with a coating material,
   an average diameter of the plurality of through holes is in a range from 10 nm to 500 nm, and
   a variation of diameters of the plurality of through holes is in a range from 5% to 25% of the average diameter.

2. The filter device of claim 1, wherein the average diameter of the plurality of through holes is in a range from 50 nm to 200 nm.

3. The filter device of claim 2, wherein the variation of diameters of the plurality of through holes is in a range from 10% to 20% of the average diameter.

4. The filter device of claim 1, wherein a thickness of the base membrane is in a range from 50 nm to 500 nm.

5. The filter device of claim 1, wherein an aspect ratio of the plurality of through holes is in a range from 2 to 10.

6. The filter device of claim 1, wherein the coating material includes one or more of a PE (polyethylene), a PTFE (polytetrafluoroethylene), a PVDF (polyvinylidene fluoride), a PFA (polyfluoroalkoxy), a HDPE (high density polyethylene), a PAS (polyarylsulfone), a PES (polyether sulfone), a PS (polysulfone), a PP (polyproplyene) and a PEEK (polyetheretherketone), or derivatives thereof.

7. The filter device of claim 1, wherein the ceramic material is anodic aluminum oxide.

8. The filter device of claim 1, wherein a total number of the plurality of through holes per square micron is in a range from 100 to 600.

9. The filter device of claim 1, wherein the one or more filter membranes comprises two or more filter membranes having different average hole sizes from each other.

10. The filter device of claim 9, wherein:
    the filter housing includes an inlet and an outlet, and
    a filter membrane of the two or more filter membranes having a larger average hole size is located closer to the inlet than a filter membrane of the two or more filter membranes having a smaller average hole size.

11. A liquid supplying system comprising:
    a semiconductor wafer processing apparatus;
    a liquid tank configured to store a liquid for manufacturing a semiconductor device;
    a liquid supply system for supplying the liquid from the liquid tank to the semiconductor wafer processing apparatus; and
    a point-of-use (POU) filter device disposed on the liquid supply system,
    wherein the POU filter device includes:
      one or more filter membranes; and
      a filter housing enclosing the one or more filter membranes,
    each of the filter membranes includes a base membrane made of anodic aluminum oxide, and a plurality of through holes,
    the base membrane is coated with a coating material,
    an average diameter of the plurality of through holes is in a range from 10 nm to 500 nm, and
    a variation of diameters of the plurality of through holes is in a range from 5% to 25% of the average diameter.

12. The liquid supplying system of claim 11, wherein the average diameter of the plurality of through holes is in a range from 50 nm to 200 nm.

13. The liquid supplying system of claim 12, wherein the variation of diameters of the plurality of through holes is in a range from 10% to 20% of the average diameter.

14. The liquid supplying system of claim 11, wherein a thickness of the base membrane is in a range from 50 nm to 500 nm.

15. The liquid supplying system of claim 11, wherein the coating material includes one or more of a PE (polyethylene), a PTFE (polytetrafluoroethylene), a PVDF (polyvinylidene fluoride), a PFA (polyfluoroalkoxy), a HDPE (high density polyethylene), a PAS (polyarylsulfone), a PES (polyether sulfone), a PS (polysulfone), a PP (polypropylene) and a PEEK (polyetheretherketone), or derivatives thereof.

16. The liquid supplying system of claim 11, wherein the semiconductor wafer processing apparatus is a chemical mechanical polishing (CMP) apparatus, and the liquid is a CMP slurry.

17. The liquid supplying system of claim 11, further comprising a circulation path for circulating the liquid from the liquid tank to the liquid tank,
wherein the circulation path includes another filter device.

18. A method of cleaning a filter device, comprising:
determining whether the filter device is to be cleaned or not; and
after determining that the filter device is to be cleaned, flowing a cleaning solution through the filter device in a reverse direction,
wherein the filter device includes:
a filter membrane; and
a filter housing enclosing the filter membrane,
the filter membrane includes a base membrane made of anodic aluminum oxide, and a plurality of through holes,
the base membrane is coated with a coating material,
an average diameter of the plurality of through holes is in a range from 10 nm to 500 nm, and
a variation of diameters of the plurality of through holes is in a range from 5% to 25% of the average diameter.

19. The method of claim 18, wherein the determining comprises:
monitoring a flow rate of a liquid passing through the filter device; and
determining whether the flow rate is below a threshold rate.

20. The method of claim 18, wherein the cleaning solution is water or an organic solvent.

* * * * *